United States Patent
Godbillon et al.

(10) Patent No.: US 10,165,641 B2
(45) Date of Patent: Dec. 25, 2018

(54) LIGHT EMISSION MODULE WITH ENHANCED CONTROL IN PARTICULAR FOR A MOTOR VEHICLE

(71) Applicant: VALEO VISION, Bobigny (FR)

(72) Inventors: Vincent Godbillon, Bobigny (FR); Patrice Collot, Bobigny (FR); Franck Millon, Bobigny (FR); Jean-Didier Kinfack, Bobigny (FR); Lothar Seif, Bobigny (FR); Arnaud Abala, Bobigny (FR); Lingxuan Zhu, Bobigny (FR); Natacha Audy, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/718,111

(22) Filed: Sep. 28, 2017

(65) Prior Publication Data

US 2018/0092180 A1    Mar. 29, 2018

(30) Foreign Application Priority Data

Sep. 28, 2016 (FR) .................................. 16 59231

(51) Int. Cl.
*F21S 41/20* (2018.01)
*F21S 43/14* (2018.01)
(Continued)

(52) U.S. Cl.
CPC ........ *H05B 33/0845* (2013.01); *F21S 41/147* (2018.01); *F21S 41/153* (2018.01);
(Continued)

(58) Field of Classification Search
CPC .. F21S 41/28; F21S 43/14; F21S 43/15; F21S 43/195; F21S 43/26; F21S 48/1233;
(Continued)

(56) References Cited

U.S. PATENT DOCUMENTS 5,673,995 A    10/1997  Segaud
2003/0147253 A1*  8/2003  Shy ...................... B60Q 1/2665
                                                              362/545
(Continued)

FOREIGN PATENT DOCUMENTS

DE    10 2006 031 345 A1    1/2008
EP      0 531 185 A1         3/1993
(Continued)

OTHER PUBLICATIONS

French Preliminary Search Report dated Feb. 22, 2017 in French Application 16 59231, filed on Sep. 28, 2016 (with English Translation of Categories of Cited Documents).

*Primary Examiner* — Daniel D Chang
(74) *Attorney, Agent, or Firm* — Oblon, McClelland, Maier & Neustadt, L.L.P.

(57) ABSTRACT

A light emission module, in particular for a motor vehicle. The module includes a substrate comprising a curved main portion extending in a longitudinal direction. A plurality of electroluminescent elements is arranged on the substrate and configured to emit light rays when supplied with electrical energy. The electroluminescent elements are distributed along the longitudinal direction, and a control assembly suitable for regulating the electrical energy supplied to the electroluminescent elements. The control assembly has a mode of operation in which the control assembly is configured to supply the electroluminescent elements with respective electrical energies and/or powers determined at least as a function of respective main directions of light emission of the electroluminescent elements to obtain at least two maximum light intensities emitted by the electroluminescent elements in the corresponding main direction of emission which are different along the longitudinal direction of the substrate.

20 Claims, 3 Drawing Sheets

(51) Int. Cl.
| | |
|---|---|
| *F21S 43/15* | (2018.01) |
| *F21S 43/19* | (2018.01) |
| *H05B 33/08* | (2006.01) |
| *F21S 43/20* | (2018.01) |
| *H05K 1/18* | (2006.01) |
| *F21S 41/19* | (2018.01) |
| *F21S 41/147* | (2018.01) |
| *F21S 41/663* | (2018.01) |
| *F21S 41/153* | (2018.01) |
| *F21Y 115/10* | (2016.01) |
| *B60Q 3/80* | (2017.01) |
| *B60Q 1/14* | (2006.01) |
| *B60Q 1/18* | (2006.01) |
| *B60Q 1/20* | (2006.01) |
| *B60Q 1/32* | (2006.01) |
| *F21W 103/55* | (2018.01) |
| *F21W 102/13* | (2018.01) |
| *F21W 103/35* | (2018.01) |
| *F21W 102/30* | (2018.01) |
| *F21W 103/10* | (2018.01) |

(52) U.S. Cl.
CPC ............... *F21S 41/19* (2018.01); *F21S 41/28* (2018.01); *F21S 41/285* (2018.01); *F21S 41/663* (2018.01); *F21S 43/14* (2018.01); *F21S 43/15* (2018.01); *F21S 43/19* (2018.01); *F21S 43/195* (2018.01); *F21S 43/26* (2018.01); *H05K 1/189* (2013.01); *B60Q 1/1407* (2013.01); *B60Q 1/18* (2013.01); *B60Q 1/20* (2013.01); *B60Q 1/32* (2013.01); *B60Q 3/80* (2017.02); *B60Q 2400/30* (2013.01); *F21W 2102/13* (2018.01); *F21W 2102/30* (2018.01); *F21W 2103/10* (2018.01); *F21W 2103/35* (2018.01); *F21W 2103/55* (2018.01); *F21Y 2115/10* (2016.08)

(58) Field of Classification Search
CPC ...... F21S 48/212; F21S 48/2212; B60Q 1/26; B60Q 3/80; B60Q 1/1407; B60Q 1/18; B60Q 1/20; B60Q 1/32; B60Q 2400/30; H05K 1/189; F21Y 2115/10
USPC .......................................................... 315/77
See application file for complete search history.

(56) References Cited

U.S. PATENT DOCUMENTS

| | | |
|---|---|---|
| 2003/0193815 A1 | 10/2003 | Mishimagi |
| 2009/0073709 A1 | 3/2009 | Yajima et al. |
| 2012/0182755 A1 | 7/2012 | Wildner |
| 2013/0135855 A1 | 5/2013 | Wildner |
| 2013/0329445 A1 | 12/2013 | Oh |
| 2014/0265934 A1* | 9/2014 | Ramey .................... B60Q 3/54 315/307 |
| 2017/0332463 A1* | 11/2017 | Buttolo ............. H05B 37/0281 |

FOREIGN PATENT DOCUMENTS

| | | |
|---|---|---|
| EP | 1 914 116 A2 | 4/2008 |
| EP | 2 671 756 A2 | 12/2013 |
| JP | 2011-187331 | 9/2011 |

* cited by examiner

LIGHT EMISSION MODULE WITH ENHANCED CONTROL IN PARTICULAR FOR A MOTOR VEHICLE

BACKGROUND

The field of the invention relates to the light emission devices for motor vehicles, and in particular to the lighting and/or signaling devices.

As is known, many of these devices comprise a light emission module provided with a plurality of electroluminescent elements forming the light emission core of the device.

In some applications, in particular for the signaling devices, the devices exhibit a profile with curved lines, that is to say a curved profile, so as to take on the form of the bodywork where they are received.

This geometrical configuration is reflected by numerous constraints on the design of the devices.

In effect, in addition to considerations of homogeneity of the light output obtained which has to be reflected by a difficulty, even an impossibility, for the observer to distinguish the electroluminescent elements individually within it, this type of device is subject to regulations which require in particular the device to exhibit a spatial distribution of given light intensity, within which, for at least certain directions, the light intensity emitted by the device exhibits a value greater than a predetermined minimum value and/or less than a predetermined maximum value.

Now, obtaining a device with both curved lines and exhibiting this property is not easy.

One solution commonly employed to achieve this result consists in having a substrate receiving the electroluminescent elements that takes the form of a plurality of planar plates separated from one another and oriented substantially orthogonally to the envisaged preferred direction of emission.

This solution does have drawbacks, particularly in terms of compactness and complexity. In effect, because of the curved line of the device, these plates have to exhibit a relative staircase arrangement, which is reflected by a significant occupied volume and by the presence of numerous elements for connecting and fixing the plates within the device, in addition to any possible phenomena of masking of the electroluminescent elements by the neighboring substrates.

In practice, this renders this solution difficult to apply in some cases, even impossible to use.

BRIEF SUMMARY

Also, the invention aims to propose a light emission module and a light emission device that do not exhibit these drawbacks.

To this end, the invention relates to a light emission module, in particular for a motor vehicle, comprising:
- a substrate comprising a curved main portion extending in a longitudinal direction,
- a plurality of electroluminescent elements arranged on the substrate and configured to emit light rays when supplied with electrical energy, and
- a control assembly suitable for regulating the electrical energy supplied to the electroluminescent elements, the control assembly having a mode of operation in which the control assembly is configured to supply the electroluminescent elements with respective electrical energies and/or powers determined at least as a function of respective main directions of light emission of the electroluminescent elements to obtain at least two maximum light intensities emitted by the electroluminescent elements in the corresponding main direction of emission which are different along said longitudinal direction of the substrate.

According to one aspect of the invention, in said mode of operation, the control assembly is configured to regulate the intensity of the electrical current supplied to the electroluminescent elements to obtain said different maximum light intensities.

According to one aspect of the invention, the substrate further comprises a plurality of tabs extending from the main portion, the tabs being distributed along the longitudinal direction.

According to one aspect of the invention, the tabs are substantially planar.

According to the aspect of the invention, the electroluminescent elements are arranged on the tabs, the electroluminescent elements arranged on a given tab forming a group of electroluminescent elements.

According to one aspect of the invention, in the mode of operation, the control assembly is configured to regulate the electrical energy supplied to the electroluminescent elements to obtain maximum light intensities supplied by the electroluminescent elements that are substantially identical within a given group.

According to one aspect of the invention, at least two electroluminescent elements exhibit different operating characteristics such that the maximum light intensities respectively emitted by said two electroluminescent elements are different with given supplied electrical power, the electrical energy supplied to a given electroluminescent element being determined also from the operating characteristics of said electroluminescent element.

According to one aspect of the invention, in said mode or operation, for at least a part of the length of the substrate along said longitudinal axis, the control assembly is configured to regulate the electrical energy and/or power supplied to the electroluminescent elements such that the respective light intensities of the electroluminescent elements increase in a given direction of travel of said part of the length of the substrate.

According to one aspect of the invention, the control assembly comprises a plurality of control modules respectively associated with at least one electroluminescent element and respectively configured to regulate the electrical energy and/or power supplied to the associated electroluminescent element or elements.

According to one aspect of the invention, the control modules are arranged in contact with the substrate and are distributed along the substrate.

According to one aspect of the invention, for at least a part of the electroluminescent elements, each electroluminescent element of said part exhibits a main direction of light emission offset angularly from a normal to the substrate in a zone of said substrate receiving the electroluminescent element concerned.

According to one aspect of the invention, all or part of the electroluminescent elements of said part exhibits a main direction of light emission substantially parallel to a local plane tangential to the substrate in said zone receiving the electroluminescent element concerned.

According to one aspect of the invention, the light emission module further comprises a diffusion screen arranged facing the electroluminescent elements and provided to form a surface illuminated from the light rays emitted by the electroluminescent elements.

According to one aspect of the invention, the diffusion screen, the substrate and the electroluminescent elements are configured for said illuminated surface to be substantially homogeneous.

The invention relates also to a motor vehicle lighting and/or signaling device, comprising a light emission module as defined above.

According to one aspect of the invention, the vehicle extends along an axis, the control assembly being configured to, in said mode of operation, regulate the electrical energy and/or power supplied to said electroluminescent elements such that the lighting and/or signaling device exhibits a spatial distribution of light intensity exhibiting, for a plurality of directions, a light intensity emitted in each of said directions exhibiting a value greater than a predetermined minimum value and/or a value less than a predetermined maximum value.

According to one aspect of the invention, the vehicle extending along an axis, the control assembly being configured to, in said mode of operation, regulate the electrical energy and/or power supplied to said electroluminescent elements such that the maximum light intensity respectively emitted by all or part of the electroluminescent elements is all the greater given that the angle formed between the main direction of emission of the electroluminescent element concerned and the axis of the vehicle is small.

BRIEF DESCRIPTION OF THE DRAWINGS

The invention will be better understood on reading the following detailed description, given purely as an example and with reference to the attached figures, in which.

DETAILED DESCRIPTION

Figure 1A:
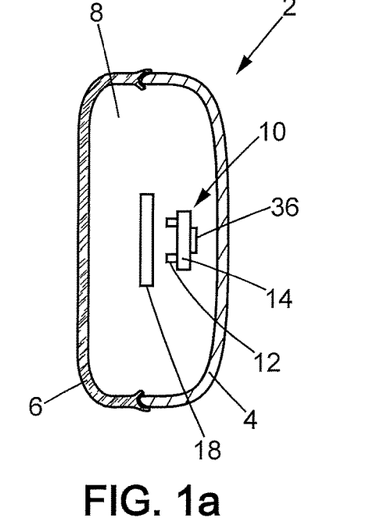
FIGS. 1a and 1b are schematic illustrations of a light emission device according to the invention.
Figure 1B:
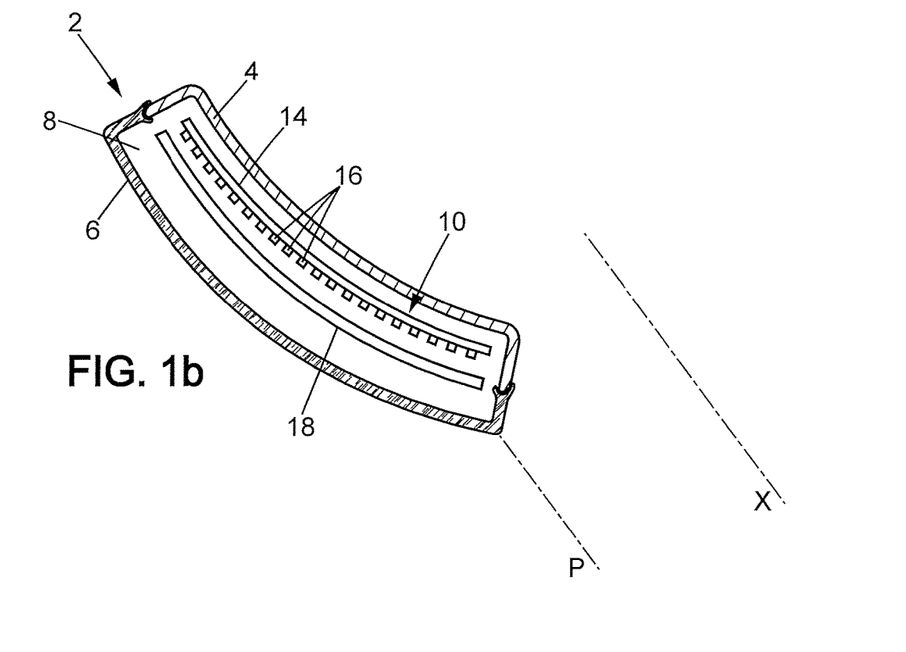

FIGS. 1a and 1b illustrate a light emission device 2 according to the invention, hereinbelow device 2.

The device 2 is configured to emit light.

In the context of the invention, the device 2 is advantageously intended to be incorporated in a motor vehicle. In other words, it is a matter of a motor vehicle light emission device.

Advantageously, the device 2 is a motor vehicle lighting and/or signaling device.

It is for example configured to implement one or more photometric functions.

A photometric function is, for example, a lighting and/or signaling function visible to the human eye. Note that these photometric functions may be the subject of one or more regulations establishing requirements of colorimetry, of intensity, of spatial distribution according to a so-called photometric grid, or even ranges of visibility of the emitted light.

The device 2 is for example a lighting device and then constitutes a vehicle headlight intended to be arranged at the front of the vehicle. It is then configured to implement one or more photometric functions for example chosen from among a low beams function called "code function", a high beams function called "road function", a fog light function.

Alternatively, or in parallel, the device is a signaling device intended to be arranged at the front or at the rear of the vehicle.

When it is intended to be arranged at the front, the photometric functions that it is configured to implement (possibly in addition to that or those that it implements in its capacity of lighting device) include a direction change indication function, a daytime running light function known by the acronym DRL, a position light function, a front light signature function, a so-called "side-marker" function, which can be reflected by lateral signaling.

When it is intended to be arranged at the rear, these photometric functions include a reversing indication function, a stop function, a fog light function, a direction change indication function, a rear light signature function, a tail light function, a "side-marker" function.

Alternatively, the device 2 is provided for the interior lighting of a vehicle and is then intended to emit light mainly in the vehicle interior.

Hereinbelow, the device 2 is described in a nonlimiting manner in a configuration in which it is intended to emit light outside the vehicle and is a rear signaling device.

Referring to FIGS. 1a and 1b, the device 2 comprises a housing 4 and a closing outer lens 6 cooperating with one another to internally delimit a cavity 8. The device 2 further comprises a light emission module 10 according to the invention, hereinbelow module 10.

In the context of the invention, the device 2 has curved lines or is curved. In other words, seen from above, at least the outer lens 6 is curved, here to take on the form of the bodywork of the vehicle in the region where the device 2 is intended to be arranged. The left-most portion of the device in FIG. 1b is for example intended to be arranged on the outside of the vehicle, the right-hand part being, conversely, oriented toward a median plane of the vehicle.

The module 10 is arranged wholly or partly in the cavity 8. In some embodiments, the device 2 optionally comprises a reception recess for receiving the module 10. This recess is for example arranged in the housing 4. This housing is advantageously closed. It is for example defined by an enclosure forming a rear portion of this recess, and by a diffusion screen described hereinbelow or an element on which the diffusion screen is formed, which cooperates with said enclosure. The internal walls of this recess other than the screen are for example reflecting and/or diffusing for the light emitted by the module 10 which reaches them (the screen being diffusing but not reflecting, as described hereinbelow).

The module 10 is configured to emit light. Advantageously, as in the example of FIGS. 1a and 1b, it is arranged to emit light toward the closing outer lens (which is transparent to at least a part of this light emitted by the module 10).

In the context of the invention, the device 2 is configured to exhibit a spatial distribution of light intensity exhibiting, for at least a plurality of given directions, minimum and/or maximum values. In other words, in these directions, the light intensity emitted by the device 2 must be greater than and/or less than a predetermined threshold value (this value or these values are for example defined for each direction considered). The threshold values are for example defined by one or more regulations. Such a direction P is illustrated in FIG. 1b, and is for example a horizontal direction (in the sense of the orientation of the device 2 within the vehicle)

parallel to an axis of movement X (horizontal) of the vehicle along which the vehicle extends and along which the light intensity emitted by the device 2 must be greater than a given threshold value. This direction P can be seen as a preferred direction of emission (out of a plurality).

These considerations of distribution of intensity is reflected by strong constraints on the module 10 in terms of light intensity emitted as a function of the direction considered.

Figure 2:
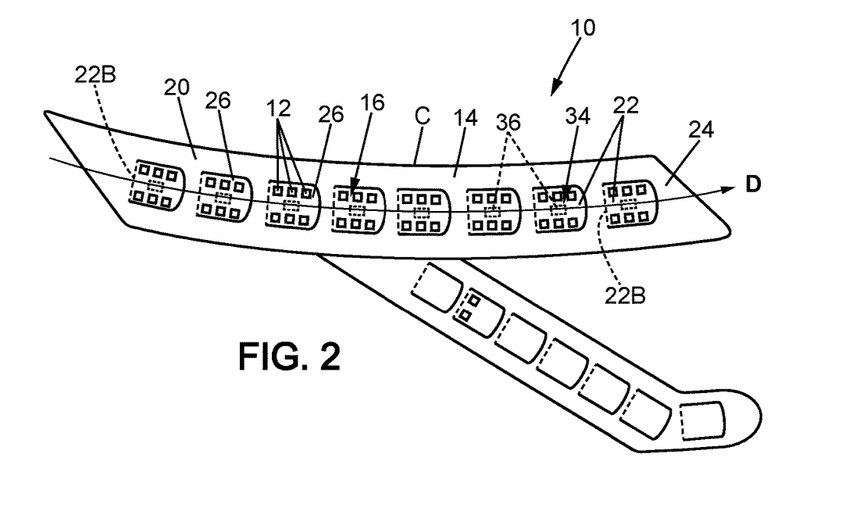
FIG. 2 illustrates a front view of a part of a light emission module of the device of FIG. 1.

Referring to FIGS. 1a, 1b and 2, the module 10 comprises a substrate 14, electroluminescent elements 16 and a screen 18.

The substrate 14 forms a support for the electroluminescent elements 16.

Furthermore, it is configured to route electrical energy to the electroluminescent elements 16 for the generation of light rays by the latter. To this end, it comprises electrical energy routing means configured to connect the elements 16 to an electrical energy source. These means comprise, for example, metal or metallized connection elements, such as copper tracks or wires.

Note that FIG. 2 illustrates two substrates 14 arranged in contact with one another. They can be seen as belonging to distinct modules 10 that the device 2 comprises. In this configuration, the respective screens 18 of the modules 10 are for example formed on one and the same part. As also illustrated in this figure, the substrate 14 is arranged substantially horizontally in relation to the orientation of the vehicle (upper substrate), or else is inclined in relation to the horizontal (lower substrate).

The substrate 14 has a generally polygonal form, such as rectangular. It extends along a longitudinal direction, or path, D. This direction or path can be curved, for example to take account of a curved line of the substrate and/or else to take account of the geometrical configuration of the substrate, whose form is optionally curved, for example bent (as illustrated for the lower substrate in FIG. 2). This curvature is for example the result of a flexing of the substrate (or of a portion of the substrate).

The substrate 14 has an outline C having rectilinear or non-rectilinear edges.

The substrate 14 comprises a main portion 20 and tabs 22.

The main portion 20 is delimited externally by the outline C and confers on the substrate 14 its general appearance. It takes the general form of a polygonal plate, such as rectangular, whose thickness is small in relation to its other dimensions. Its corners are optionally rounded.

The portion 20 is formed by all of the substrate apart from the tabs 22 described hereinbelow.

Advantageously, the main portion 20 is flexible. More specifically, it is adapted to be deformed elastically, in particular under the effect of a flexing load, such as a flexing tending to bring its longitudinal ends closer to one another and normally applied to a face of the substrate.

This in particular allows the main portion and the substrate to have curved lines, particularly to be arranged substantially parallel to the closing outer lens 6 and/or to the rear wall of the housing 4 when the device 2 has curved lines. In other words, the main portion advantageously has a curved line, for example identical to that of the closing outer lens and/or to that of the screen 18 over all or part of its length.

The tabs 22 take the form of tongues of material. They extend from the main portion. More specifically, they each extend from an inner edge of the main portion. In other words, they do not extend from an outer edge of the substrate 14, that is to say from the edge turned toward the outside of the substrate 14.

These tabs are for example formed by cutting the substrate, which initially has a solid surface.

The tabs 22 are connected to the main portion 20 by a connecting edge 22B (in dotted lines on some tabs of FIG. 2), and their other edges are free, that is to say separated from the substrate 14. The connecting edge 22B is for example made of a single piece with the main portion.

Advantageously, the tabs have a general polygonal form, such as rectangular, of which all or some of the corners are optionally rounded. The connecting edge 22B corresponds to at least one side of this polygon, the other sides forming free edges.

Advantageously, they have substantially identical dimensions, at least for some of them. Note that, for substrate bulk or form reasons, the end tabs can be made to have dimensions even a form different from those of the tabs which are not proximal in relation to the ends of the substrate.

The tabs 22 are substantially planar. Furthermore, advantageously, they are arranged to remain substantially planar in case of elastic flexing on the main portion.

Figure 3:
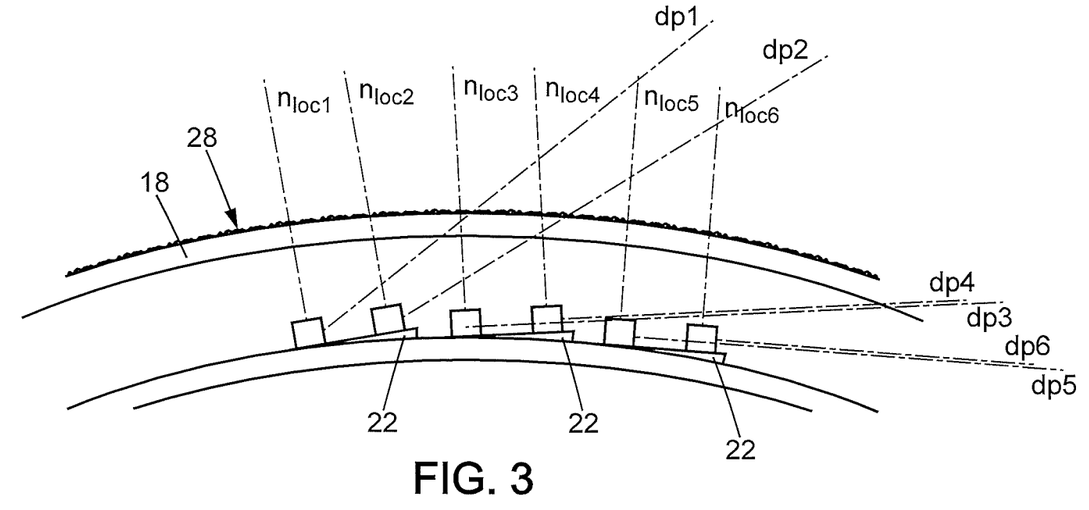
FIG. 3 illustrates a plan view of a part of the light emission module according to the invention.

FIG. 3 illustrates the geometrical configuration of the tabs in such a flexed configuration. In this configuration, the tabs extend substantially in a plane that is locally tangential to the main portion.

The tabs are advantageously produced from the same material as the rest of the substrate 14. Their flatness, particularly in flexed configuration of the main portion, causes the transmissions of flexing loads imparted on the main portion to the components arranged on the tabs and/or to the welds securing said components to the surface of said tabs to be limited.

The substrate 14 comprises, for example, a plurality of tabs 22 arranged consecutively along the substrate. They are for example thus arranged aligned along a longitudinal direction of the substrate.

They exhibit, for example, one and the same spatial orientation. For example, as illustrated in FIG. 2, their connecting edge 22B forms a longitudinal end of the proximal tabs in relation to one and the same end of the substrate, the opposite end being turned toward the tab 22 that comes after in the direction of travel of the substrata from this end toward the other end.

Preferentially, the connecting edge 22B of the tabs is substantially parallel to the local axis of curvature of the substrate. In this way, the tabs are mechanically constrained little or not at all by the substrate 14 flexing load.

Note that the substrate can comprise a row of tabs as illustrated in FIG. 2, or else a plurality of rows of tabs extending parallel to one another and offset from one another transversely to this longitudinal direction.

The substrate is for example produced from a reinforced epoxy resin composite, typically with glass fibers. For example, it is produced from a material commonly called PCB FR-4 (PCB being the acronym for printed circuit board).

It advantageously has a thickness of between 0.3 mm and 1.6 mm. This configuration, combined with the presence of openings (the outline of the tabs) produced in the surface of the substrate, makes it possible to promote the flexibility of the substrate and makes it possible to dispense with costly materials commonly used to form flexible substrates.

As described hereinbelow, the electroluminescent elements 16 are arranged on a given face 24 of the substrate.

Advantageously, this face 24 is adapted to reflect at least a part of the light from the elements 16 and reaching them.

For example, to this end, this face is white.

Advantageously or in parallel, this face 24 is also configured to diffuse at least part of the light from the elements 16 and reaching it.

For example, to this end, it has suitable roughnesses.

The electroluminescent elements 16 are each configured to emit light when appropriately supplied with electrical energy. These elements 16 form the light emission core of the module 10.

Advantageously, these elements 16 are semiconductor electroluminescent elements suitable for generating photons by electroluminescence. Advantageously, each element 16 of at least a part of the elements 16 that the module 10 comprises is formed from a light-emitting diode. For example, all are "Formed from" should be understood here to mean that the photoemissive structure that the element 16 comprises is a light-emitting diode, sometimes by called LED chip.

Advantageously, in some embodiments, at least a part of the electroluminescent elements 16 comprises a diode and a housing 26 within which the corresponding diode is arranged. The housings 26 are sometimes called "packages".

The arrangement of the diode within the housing is chosen to obtain a main direction of emission from the corresponding diode which is chosen with given orientation of the associated housing 26. This main direction corresponds to the direction in which the element 16 concerned emits a maximum light intensity.

The electroluminescent elements 16 are arranged on the substrate. As indicated previously, they are arranged on one and the same face 24 of the substrate. This face 24 is turned toward the screen 18 and the closing outer lens 6.

To this end, the housings 26 are fixed onto the face 24.

In the context of the invention, the electroluminescent are advantageously arranged on the tabs 22 of the substrate. For example, they are arranged on the latter with two or more than two per tab, for example 4, 6, 8, 10 or more per tab. The elements 16 arranged on a given tab form a group of electroluminescent elements.

The elements 16 are advantageously arranged in one or more rows on the substrate. These rows are advantageously each parallel to the longitudinal direction D of the substrate (which can be incurved according to the configuration of the substrate 14 considered).

In the example of the figures, the elements 16 are thus arranged in two parallel rows.

Advantageously, the distance separating two consecutive elements 16 along the substrate is substantially constant.

Advantageously, for at least a part of the elements 16, each element 16 is associated with at least one element 16 located substantially at the same location along the substrate. In other words, the corresponding electroluminescent elements are also arranged in columns each comprising at least two elements 16.

Advantageously, for at least a part of the elements 16, the elements 16 are configured to exhibit a main direction of emission offset angularly from the direction normal to the substrate in the zone of the substrate bearing the element 16 concerned. In other words, this direction does not correspond to the local normal to the substrate.

For example, the elements 16 are configured to emit light in a preferred main direction lying angularly between a plane parallel to a local plane tangential to the corresponding zone of the substrate and the local normal to the substrate.

Advantageously, the corresponding elements 16 are configured to emit light in a preferred direction lying in a plane substantially parallel to the local plane tangential to the corresponding zone of the substrate. In other words, as illustrated in FIG. 3, the electroluminescent elements are configured for this direction to be parallel to the tab 22 on which they are located.

The corresponding elements 16 are for example light-emitting diodes, known by the name "side-LED".

In practice, the desired main direction is obtained by arranging the diode appropriately within the corresponding housing 26 approximately.

Note that these configurations can be combined, the module 10 comprising elements 16 parallel to the local tangential plane to the substrate considered and/or others emitting angularly between the plane parallel to the local tangential plane and the normal to the zone considered.

Note, furthermore, that alternatively or in parallel to the presence of the electroluminescent elements having a main direction of emission as above, the module 10 can comprise electroluminescent elements whose main direction corresponds substantially to the local normal to the substrate.

In FIG. 3, the main directions oriented parallel to the tangential local plane have references dp3 to dp6 and the associated local normals are referenced $n_{loc3}$ to $n_{loc6}$. The main directions having a configuration that is simply inclined with respect to the other corresponding normal are referenced dp1 and dp2 (the associated local normals are referenced $n_{loc1}$ and $n_{loc2}$).

In some embodiments, the module 10 comprises only elements 16 having a main direction parallel to the local tangential plane.

The module 10 is for example configured to emit white light, or even red or amber light. Other colors can be envisaged depending on the targeted application.

Mote that the module 10 can comprise elements 16 configured to emit white light, others amber light and/or others red light.

The elements 16 each exhibit operating properties which define, for a given received electrical energy or electrical power, the light intensity and the color that they supply.

In practice, as is known, these operating properties cannot be finely controlled in fabricating the electroluminescent elements, such that diodes having a same product reference, for example a supplier reference, may however exhibit at least given light intensities that are substantially different to one another with given electrical power.

This aspect is the source of the so-called "binning" method, which is a sorting of the elements produced according to their operating properties into different categories, or "bins", within which the elements have similar operating properties. It is thus possible to obtain elements 16 having similar, even substantially identical, operating properties.

In the context of the invention, advantageously, at least a part of the elements 16 exhibits distinct operating properties with given electrical energy or electrical power. This makes it possible to minimize the cost of the device 2, the use of only elements belonging to a given bin being more costly.

The screen 18 is configured to have a surface illuminated from the light emitted by the elements 16. Furthermore, it is configured to diffuse at least a part of the light received from the photoemissive elements and passing through it.

Preferentially, together with the substrate 14 and the photoemissive elements, the screen is configured to exhibit a substantially homogeneous illuminated surface. Homogeneity should be understood to mean that the photoemissive elements cannot be distinguished by the naked eye within this illuminated surface by an observer whose gaze is directed toward the screen.

In practice, this property results—all other things being equal—from the combination of the distribution density of the photoemissive elements on the substrate and the distance between the substrate and the screen.

Advantageously, to this end, for at least a part of the photoemissive elements and advantageously for all, the distance between two adjacent photoemissive elements is lees than or equal to the distance which separates them from the screen, and advantageously less than 70% of the latter.

Note that the homogeneity can be quantified.

For example, by denoting it H, it can be determined from or as minimum between, on the one hand, a local uniformity L_U and a global uniformity G_U.

The global uniformity is for example determined from the relationship:

$$G\_U = 100 * \left(1 - \frac{\sigma(L_{ROI})}{Moy(L_{ROI})}\right)$$

in which ROI denotes the illuminated surface presented by the screen and $L_{ROI}$ denotes the luminance of the illuminated surface ($\sigma$ denotes the standard deviation and Moy the average).

The local uniformity is for example determined as follows. Consider a pixel X of the illuminated surface, the square region of side n (for example n pixels) centered on X, and 8 square adjacent regions of side n, these regions being respectively centered on pixels $X_i$ each being located at a distance n from the point X. The points Xi are for example evenly distributed around X.

The local contrast 1_c is defined as a function of n according to the relationship $$1\_c(n) = \max_{\forall X \in ROI} \left(\max_{i=1,\ldots,n} \left(\frac{|M - Mi|}{|M + Mi|}\right)\right)$$

in which M and Mi are the average luminances of the pixels of the region centered on X, on the Xi considered respectively.

The quantity MSlocal_contrast is determined as maximum of the local contrasts 1_c(n) for n=2p+1, with p ranging from 1 to 20, and the quantity L_U is determined according to the relationship L_U=100(1−2MSlocal_contrast).

Note that, in some embodiments in which the device 2 comprises two relatively distinct zones, the global homogeneity is for example determined as minimum of the respective homogeneities of the two regions.

Furthermore, it will be possible to determine it as linear combination (or alternatively, as minimum) of the homogeneity considered on various axes.

Also, in the context of the invention, the homogeneity H is advantageously greater than 85%.

Note that the screen 18 is at least partly transparent to the light from the elements 16.

Several configuration are envisaged to obtain the diffusing effect of the screen 18.

In a first configuration, the screen 18 is said to be diffusing "in the mass". In other words, it is produced from a diffusing material. This type of material is sometimes called opalescent.

Alternatively, the screen has a surface provided with microstructures 28 provided to diffuse the light from the photoemissive elements. They are advantageously provided to diffuse the light by diffraction in transmission.

These microstructures 28 are for example formed in the surface of the outer face of the screen, that is to say of the face turned toward the closing outer lens. They are present over all of the surface of the screen (they are illustrated on just a part of the screen 18 in FIG. 4 in the interest of clarity).

Figure 4:
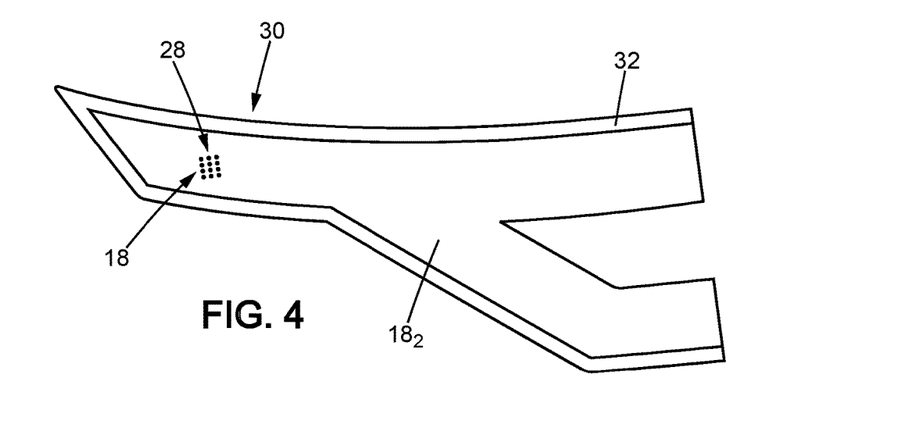
FIG. 4 illustrates a diffusion screen of a light emission module according to the invention.

Advantageously, the microstructures 28 are obtained by injection.

These microstructures for example take the form of depressions or protuberances formed in the surface of the face of the screen. They exhibit characteristic dimensions of an order of magnitude lying between that of the wavelength of the light emitted by the elements 16 and 100 times the latter.

The screes 18 has a generally polygonal form, such as rectangular. It for example has a strip form. Its corners are optionally rounded.

The screen is arranged facing the face of the substrate 14 bearing the photoemissive elements 16. It is situated away from this face and from the photoemissive elements.

The screen is situated at a distance from the substrate for example lying between 20 mm and 90 mm.

Advantageously, the screen 18 has curved lines. Preferentially, it exhibits a curved line identical to that of the substrate over at least a part of its length. In other words, the screen, or more specifically its face bearing the microstructures, is arranged substantially parallel to at least a part of the main portion of the substrate (that is to say of the large face thereof turned toward the screen). In this way, for at least a part of the elements 16, all the photoemissive elements considered are all located substantially at the same distance from the screen 18.

Note that, optionally, as illustrated in FIG. 4, the screen 18 is borne by an element 30 belonging to the module 10. In addition to the screen 18, this element 30 comprises a fixing portion 32 surrounding the screen over at least a part of its perimeter. This portion 32 is provided for the fixing of the element 30 within the volume 8, and, optionally, within the recess 12, and for the handling of the element 30.

Note that the element 30 can comprise several screens, as illustrated in FIG. 4. In this figure, it comprises a first substantially horizontal screen and a second screen 18₂ of bent form extending from the first at an incline in relation to the horizontal.

In the context of the invention, in addition to the elements described above, the module 10 further comprises a control assembly 34 for controlling the electroluminescent elements 16.

The control assembly 34 is configured to regulate the electrical energy and/or the electrical power supplied to the elements 16 for switching them on and switching them off and for controlling the light intensity emitted by each of them.

The control assembly 34 advantageously comprises a plurality of control modules 36 distributed along the substrate. Each module is coupled to a plurality of elements 16 for the control thereof.

For example, a given control module is associated with the elements 16 arranged on a given tab. The control module is situated for example on the tab itself, for example on the face opposite the face 24, or alongside the tab on the main portion 20.

These modules comprise, for example, a programmable microcontroller such as an integrated circuit of ASIC (application-specific integrated circuit) type, or an integrated regulator, or a regulator produced by means of discrete components.

According to the invention, the control assembly 34 has a mode of operation in which it is configured to control the supply to the electroluminescent elements of respective electrical energies (or powers) determined at least as a function of the main direction of emission of the electroluminescent elements to obtain at least two maximum light intensities emitted by the electroluminescent elements in the corresponding main direction which are different.

Here, it is understood that this mode of operation constitutes a true intentional mode of operation of the device and one that can be maintained in time, and not simply a transient state of the device, for example when it is switched on.

Furthermore, in this mode of operation, the elements 16 considered are kept switched on. This mode of operation is advantageously selectively activatable and deactivatable.

To this end, advantageously, the control assembly 34 is configured to implement this functionality by controlling the intensity of the electrical current supplied to the elements 16. In other words, these different light intensities result at least from the regulation of the current supplied to the elements 16 by the assembly 34.

Advantageously, in this mode of operation, for at least a part of the elements 16, the control assembly 34 is configured to supply the elements 16 considered with respective electrical powers reflected by an emitted maximum light intensity that is all the greater since the angular deviation between the main direction of emission of the module considered and the axis X of the vehicle is small. In other words, the closer the direction of emission of an element 16 out of those considered is to the axis X, the higher the maximum light intensity becomes where its emission is controlled by the assembly 34. This makes it possible to facilitate the obtaining of a distribution of intensity conforming to the regulatory requirements in configurations in which this would be impossible if all the sources were controlled so as to all exhibit the same light intensity.

In an embodiment such as that of the figures, for at least a portion of the length of the substrate, this is reflected by a maximum light intensity of the elements 16 increasing along the longitudinal direction D traveled from one end of said portion to the other.

Generally, advantageously, in some embodiments, the control assembly 34 is configured to control the elements 16 so that the light intensity emitted by the latter increases from one element to the consecutive element and/or at least from one tab to another, in a direction of travel of the substrate over at least a portion of the substrate. Preferentially, the light intensity levels supplied by the elements 16 are defined such that the difference between two consecutive light intensities is sufficiently low to be indiscernible to the human eye. This makes it possible to act on the distribution of light intensities without adversely affecting the homogeneity of the system.

Note that the electrical power determined for a given element 16 is determined as a function of its operating properties, which condition in particular the light intensity of the element 16 with given electrical power. Because of this, the exact configuration of the assembly 34 to obtain the first mode of operation is greatly variable as a function of the population of elements 16 that the system comprises.

Also, for two elements 16 having similar operating properties, for example two elements having identical product references and belonging to one and the same category or "bin", the obtaining of distinct maximum light intensities is implemented by supplying the elements with distinct respective electrical intensities. Conversely, this difference in intensity of the electrical current alone can yield identical maximum intensities for elements 16 with different operating properties.

Advantageously, in some embodiments, in the first mode of operation, the control assembly 34 is configured for the elements 16 arranged on a given tab 22 to exhibit substantially identical maximum light intensities.

Advantageously, the control assembly 34 has at least one other selectively activatable mode of operation.

For example, it comprises at least one mode of operation out of:
  a mode of operation in which the electrical powers supplied to the elements 16 are configured for the maximum light intensities of the elements 16 to be substantially identical, and
  a mode of operation in which the control assembly 34 commands the elements to implement a light sequence during which all or part of the elements 16 is sequentially and/or simultaneously switched on and/or switched off.

For example, one or other of these modes is implemented in response to the detection of an event occurring in the vehicle, such as the switching on of the vehicle, the opening of a door that it comprises or else the actuation of a direction change indication command.

The operation of the device 2 will now be described with reference to the figures.

When the device 2 is started up, the control assembly 34 controls the supply of electrical energy to the elements 16, which is reflected by them being switched on.

When the mode of operation described above is implemented, for example by default, the assembly 34 ensures the regulation of the electrical energy supplied such that the maximum intensities of at least two elements 16 are distinct, and advantageously by applying all or part of the intensity schemes described above.

Another mode of operation is for example then implemented, for example in response to the detection of an event on the vehicle.

The invention offers several advantages.

First of all, it facilitates the obtaining of a distribution of light intensities conforming to the regulatory requirements and does so simply. In particular, this is particularly simple when this provision results from a control of the intensity of the electrical current supplied to the electroluminescent elements.

This is particularly advantageous for a device 2 with curved lines, for which the obtaining of a distribution of light intensities conforming to the regulatory requirements is not easy to reconcile with a homogeneous appearance of the device.

The invention claimed is:

1. A light emission module for a motor vehicle, comprising:
  a substrate comprising a curved main portion extending in a longitudinal direction (D) and a plurality of tabs extending from the main portion, the tabs being distributed along the longitudinal direction (D), the tabs including a connecting edge that connects the tabs to the main portion of the substrate and a free edge that is separated from the substrate, a plurality of electroluminescent elements positioned directly on the tabs of the substrate and configured to emit light rays when supplied with electrical energy, and a control assembly suitable for regulating the electrical energy supplied to the electroluminescent elements, the control assembly having a mode of operation in which the control assembly is configured to supply the electroluminescent elements with respective electrical energies and/or powers determined at least as a function of respective main directions of light emission (dp1, ..., dp6) of the electroluminescent elements to obtain at least two maximum light intensities emitted by the electroluminescent elements in the corresponding main direction of emission which are different along said longitudinal direction (D) of the substrate.

2. The light emission module according to claim 1, wherein, in said mode of operation, the control assembly is configured to regulate an intensity of electrical current supplied to the electroluminescent elements to obtain said different maximum light intensities.

3. The light emission module according to claim 2, wherein at least two electroluminescent elements exhibit different operating characteristics such that the maximum light intensities respectively emitted by said two electroluminescent elements are different with given supplied electrical power, the electrical energy supplied to a given electroluminescent element being determined also from the operating characteristics of said electroluminescent element.

4. The light emission module according to claim 2, wherein, in said mode of operation, for at least a part of a length of the substrate along said longitudinal axis, the control assembly is configured to regulate the electrical energy and/or power supplied to the electroluminescent elements such that the respective light intensities of the electroluminescent elements increase in a given direction of travel of said part of the length of the substrate.

5. The light emission module according to claim 1, wherein the tabs are substantially planar.

6. The light emission module according to claim 1, wherein the electroluminescent elements arranged on a given tab of the plurality of tabs form a group of electroluminescent elements.

7. The light emission module according to claim 6, wherein, in the mode of operation, the control assembly is configured to regulate the electrical energy supplied to the electroluminescent elements to obtain maximum light intensities supplied by the electroluminescent elements that are substantially identical within a given group.

8. The light emission module according to claim 1, wherein at least two electroluminescent elements exhibit different operating characteristics such that the maximum light intensities respectively emitted by said two electroluminescent elements are different with given supplied electrical power, the electrical energy supplied to a given electroluminescent element being determined also from the operating characteristics of said electroluminescent element.

9. The light emission module according to claim 1, wherein, in said mode of operation, for at least a part of a length of the substrate along said longitudinal axis, the control assembly is configured to regulate the electrical energy and/or power supplied to the electroluminescent elements such that the respective light intensities of the electroluminescent elements increase in a given direction of travel of said part of the length of the substrate.

10. The light emission module according to claim 1, wherein the control assembly comprises a plurality of control modules respectively associated with at least one electroluminescent element and respectively configured to regulate the electrical energy and/or power supplied to the associated electroluminescent element or elements.

11. The light emission module according to claim 10, wherein the control modules are arranged in contact with the substrate and are distributed along the substrate.

12. The light emission module according to claim 1, wherein, for at least a part of the electroluminescent elements, each electroluminescent element of said part exhibits a main direction of light emission offset angularly from a normal ($n_{loc1}$, ..., $n_{loc6}$) to the substrate in a zone of said substrate bearing the electroluminescent element.

13. The light emission module according to claim 12, wherein all or part of the electroluminescent elements of said part exhibits a main direction of light emission substantially parallel to a local plane tangential to the substrate in said zone receiving the electroluminescent element concerned.

14. The light emission module according to claim 1, further including a diffusion screen arranged facing the electroluminescent elements and provided to form a surface illuminated from the light rays emitted by the electroluminescent elements.

15. The light emission module according to claim 14, wherein the diffusion screen, the substrate and the electroluminescent elements are configured for said illuminated surface to be substantially homogeneous.

16. A motor vehicle lighting and/or signaling device, comprising the light emission module according to claim 1.

17. The motor vehicle lighting and/or signaling device according to claim 16, the motor vehicle extending along an axis (X), the control assembly being configured to, in said mode of operation, regulate the electrical energy and/or power supplied to said electroluminescent elements such that the lighting and/or signaling device exhibits a spatial distribution of light intensity exhibiting, for a plurality of directions, a light intensity emitted in each of said directions exhibiting a value greater than a predetermined minimum value and/or a value less than a predetermined maximum value.

18. The motor vehicle lighting and/or signaling device according to claim 16, the motor vehicle extending along an axis (X), the control assembly being configured to, in said mode of operation, regulate the electrical energy and/or power supplied to said electroluminescent elements such that the maximum light intensity respectively emitted by all or part of the electroluminescent elements is all the greater given that an angle formed between the main direction of emission of each of the electroluminescent elements and the axis of the vehicle (X) is small.

19. The light emission module according to claim 1, wherein each of the tabs is a polygon with one side forming the connected edge and each of the other sides forming the free edge.

20. The light emission module according to claim 1, wherein each of the tabs is planar.

* * * * *